United States Patent
McPartlin et al.

(10) Patent No.: US 6,424,224 B1
(45) Date of Patent: Jul. 23, 2002

(54) AUXILIARY CIRCUITRY FOR MONOLITHIC MICROWAVE INTEGRATED CIRCUIT

(75) Inventors: Michael McPartlin, North Andover; John A. DeFalco, Marlborough, both of MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/897,749

(22) Filed: Jul. 2, 2001

(51) Int. Cl.[7] .............................. H03F 3/04; H01L 23/34
(52) U.S. Cl. .................. 330/288; 257/723; 330/300
(58) Field of Search .......................... 330/288; 4/300, 4/307; 257/13 RS, 686, 685, 723–725; 438/107–114, 455

(56) References Cited

U.S. PATENT DOCUMENTS

| | | | |
|---|---|---|---|
| 4,345,213 A | * 8/1982 | Schade, Jr. | 330/288 |
| 4,450,366 A | * 5/1984 | Malhi et al. | 330/300 |
| 5,079,518 A | * 1/1992 | Wakayama | 330/288 |
| 5,365,193 A | * 11/1994 | Zuffada et al. | 330/300 |
| 5,382,916 A | * 1/1995 | King et al. | 330/257 |
| 6,166,438 A | * 12/2000 | Davidson | 257/723 |

* cited by examiner

Primary Examiner—Robert Pascal
Assistant Examiner—Khanh Van Nguyen
(74) Attorney, Agent, or Firm—Daly, Crowley & Mofford, LLP

(57) ABSTRACT

An amplifier having a two different single crystal semiconductor substrates. A first one of the substrates has formed thereon at least one input signal amplifying device, such device comprising a bipolar transistor. A second one of the substrates is a material different from the material of the first substrate. A current mirror is included. The current mirror includes a plurality of electrically interconnected active devices, one portion of the devices being bipolar devices formed on the first substrate and another portion of the active devices comprising an insulated gate field effect transistor formed on the second substrate. The first single crystal substrate is III-V material and the second single crystal substrate is silicon. The bipolar devices are HBTs. The insulated gate field effect transistor is a MOS device. This configuration minimizes the effect of temperature, voltage and process variations on critical transistor operating currents.

10 Claims, 2 Drawing Sheets

AUXILIARY CIRCUITRY FOR MONOLITHIC MICROWAVE INTEGRATED CIRCUIT

TECHNICAL FIELD

This invention relates to monolithic microwave integrated circuits (MMICs), and more particularly to auxiliary circuitry for such MMICs.

BACKGROUND

As is known in the art, MMICs are used in many applications. Typically these circuits are formed on a gallium arsenide semiconductor substrate because of the high frequency signals used in such circuits. One type of active device used in such circuit is a heterojunction bipolar transistor (HBT). Thus, for example, a MMIC amplifier used to amplify microwave signals, for example a microwave signal received from a cellular phone tower, may include a plurality of cascaded amplifier stages, each stage having an HBT.

As is also known in the art, dc biasing is required for proper operation of an amplifier. For silicon bipolar transistor amplifiers, one arrangement is to use a grounded emitter configuration with dc biasing being provided using a current source. The current source typically includes a current mirror to maintain a constant collector current in the presence of temperature, fabrication process and supply voltage variations. With an enhanced current mirror, a pair of bipolar transistors having grounded emitters is provided. The collector of a first one of the transistors may be connected to a voltage through a relatively high impedance. The collector of the first transistor is also connected to the base of an emitter follower bipolar transistor. The emitter follower transistor has its emitter connected to the base electrodes of the pair of transistors. The collector of the emitter follower transistor and the second one of the pair of transistors are connected to a common supply voltage. The current through the collector of the second transistor mirrors the current fed to the collector of the first transistor. When the current mirror is fabricated as an integrated circuit, such as on a common silicon semiconductor substrate, the voltage drop across the base-emitter junction of the second transistor will be around 0.7 volts. Thus, the voltage at the base of the emitter follower transistor will be around 1.4 volts. In applications requiring a relatively low supply voltage, say a nominal supply voltage of 3.1 volts, even with variations in the supply voltage, say a supply voltage of only 2.8 volts, there is enough head-room with the 1.4 volts at the base of the emitter follower transistor to enable proper operation of the current mirror. Temperature and process variations will alter the bipolar transistor's Vbe voltages resulting in a shift in all currents. Proper operation is when the current variation caused by temperature, process and voltage variations is sufficiently small so as to maintain a relatively constant collector current and subsequent constant amplification.

However, in a microwave application where a gallium arsenide substrate is used, the transistors being typically HBT devices, the voltage drop across the emitter-base junction will be about 1.25 volts. Therefore, with such HBTs, the voltage at the base of the emitter follower transistor will be about 2.5 volts. In the low supply voltage application described above (i.e., with a supply voltage of 2.8 volts), there is insufficient headroom to enable proper operation of this HBT current mirror and large variations in operating current will result.

SUMMARY

In accordance with the present invention, an amplifier is provided. The amplifier includes a first single crystal semiconductor substrate having formed thereon at least one input signal amplifying device, such device having a bipolar transistor. A second single crystal semiconductor substrate is provided. The second substrate is a material different from the material of the first substrate. A current mirror is included. The current mirror includes a plurality of electrically interconnected active devices, one portion of the devices being bipolar devices formed on the first substrate and another portion of the active devices comprising an insulated gate field effect transistor formed on the second substrate.

With such an arrangement, the amplifier may be used to amplify microwave signals; such amplification being provided by HBTs formed on the first material substrate. Further, the gain provided by the IGFET produces a much smaller voltage drop between the base electrode of the HBT amplifying device and the gate of such IGFET, resulting in sufficient headroom for the arrangement to operate with relatively low voltage supplies while minimizing the detrimental effects of both temperature, process and voltage variations.

In one embodiment, the first single crystal substrate is III-V material and the second single crystal substrate is silicon.

In one embodiment, the first single crystal substrate is gallium arsenide.

In one embodiment the bipolar devices are HBTs.

In one embodiment the insulated gate field effect transistor is a MOS device.

In accordance with another feature of the invention, the current mirror includes: a first single crystal semiconductor substrate; and, a second single crystal semiconductor substrate, such second substrate being a material different from the first substrate; a plurality of electrically interconnected active devices, one portion of the devices being bipolar devices formed on the first substrate and another portion of the active devices comprising an insulated gate field effect transistor formed on the second substrate.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
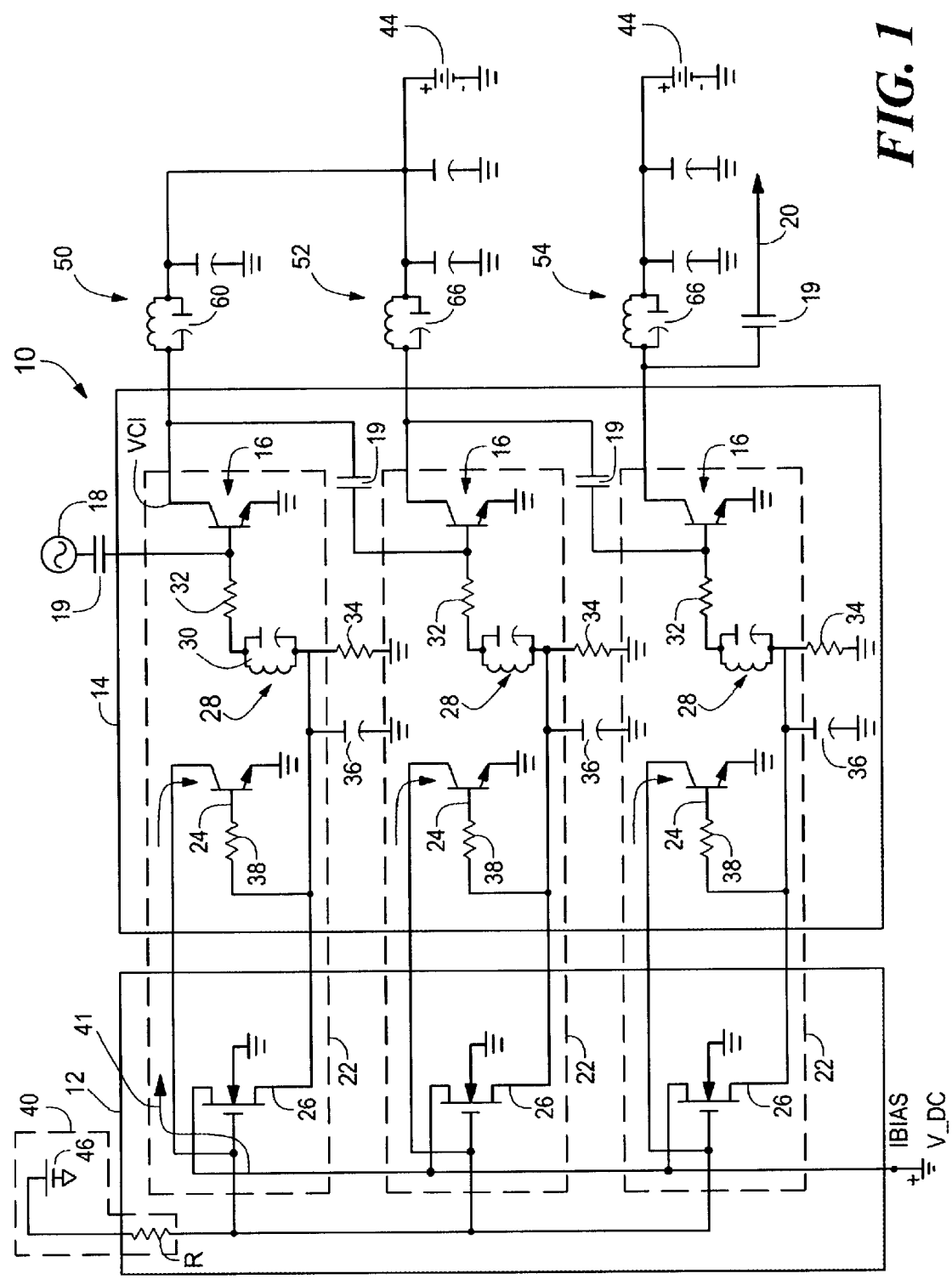
FIG. 1 is a schematic diagram of a microwave amplifier according to the invention.

Referring now to FIG. 1 a microwave amplifier 10 is shown to include a pair of single crystal semiconductor substrates 12, 14. Substrate 12 is silicon and substrate 14 is a III-V material, here gallium arsenide.

The gallium arsenide substrate 14 includes a plurality of amplifying devices, here HBTs 16, arranged to provide a multi-stage, here three stage, microwave amplifier 10 for amplifying a microwave input signal indicated by microwave signal source 18. The microwave signal has a nominal frequency, f. The microwave signal 18 is ac coupled to output 20 through the stages using capacitors 19, as indicated.

A plurality of, here three, current mirrors 22 is included and configured to supply dc biasing current to a corresponding one of the three amplifying stages, i.e., the HBTs 16, as indicated. More particularly, each one of the three current mirrors 22 includes a plurality of electrically interconnected active devices, here transistors 16, 24 and 26. One portion of the active devices, here HBTs 16 and 24 are bipolar devices formed on the gallium arsenide substrate 14 and another portion of the active devices, here insulated gate field effect transistor (IGFET) 26. Here the IGFET 26 is a MOS transistor formed on the silicon substrate 12.

The biasing circuitry 28 is included for each one of the amplifying stages, i.e., HBTs 16, as indicated. The biasing circuitry 28 includes: an L-C tank circuit 30 (tuned to the frequency, f) serially connected to the base of HBT 16 through a resistor 32 and to ground through a shunt circuit comprising resistor 34 and capacitor 36. The tank circuit 30 is also connected to the base of HBT 24 through a resistor 38, as indicated.

The biasing circuitry 28 is fed current through the current mirror 16. More particularly, a current source 40 comprising a resistor R (which while here shown on the silicon substrate 12 may be formed off the silicon substrate 12) and an off chip voltage source 46, feeds current to the collector of transistor 24 as indicated by the arrow 41. Considering the dc connections: The base of transistor 24 is connected to the base of transistor 16 and to the source of transistor 26; the gate of transistor 26 is connected to the collector of transistor 24; and, the drain of transistor 26 and the collector of transistor 16 is connected to a supply voltage 44. Here, the supply voltage 44 is a 3.4-volt supply and the supply voltage 46 is a 2.8-volt supply.

The dc voltage supply 44 is de coupled to the collectors of transistors 16 by the arrangement shown through filter sections 50, 52, and 54. Each filter section has a tank circuit 60 tuned to the frequency, f.

Figure 2:
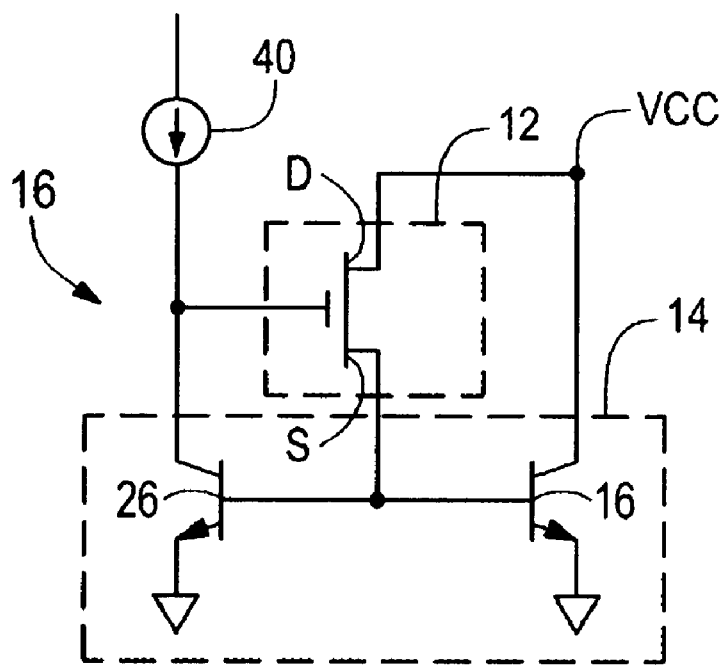
FIG. 2 is a schematic diagram of a current mirror according to the invention.

A simplified dc schematic diagram for the current mirror 16 is shown in FIG. 2. Thus, the circuitry on the silicon substrate 12 may be considered as an auxiliary circuit to the amplifying stages 16 on substrate 14. It is noted that with such an arrangement, the current mirror 16 may be used in microwave signal applications where the microwave signals are processed with HBTs formed on the second, III-V material substrate. Further, the gain provided by the IGFET 12 produces a minimal voltage drop between the base electrode of the HBT device 16 and the gate of such IGFET 12, such that there is sufficient headroom for the arrangement to operate with relatively low voltage supplies and minimizes any current variation with temperature, process and voltage.

A number of embodiments of the invention have been described. Nevertheless, it will be understood that various modifications may be made without departing from the spirit and scope of the invention. For example, other III-V materials may be used for substrate 14, such as Indium Gallium Phosphide (InGaP). Accordingly, other embodiments are within the scope of the following claims.

What is claimed is:

1. An amplifier, comprising:
    a first single crystal substrate having formed thereon:
        at least one input signal amplifying device, such device comprising a bipolar transistor;
    a second single crystal semiconductor substrate, such second substrate being a material different from the material of the first substrate;
    a current mirror comprising a plurality of electrically interconnected active devices, one portion of the active devices being bipolar devices formed on the first substrate and another portion of the active devices comprising an insulated gate field effect transistor formed on the second substrate.

2. The amplifier recited in claim 1 wherein the first single crystal substrate is III-V material and the second single crystal substrate is silicon.

3. The amplifier recited in claim 2 wherein the first single crystal substrate is gallium arsenide.

4. The amplifier recited in claim 3 wherein the bipolar devices are HBTs.

5. The amplifier recited in claim 4 wherein the insulated gate field effect transistor is a MOS device.

6. A current mirror, comprising:
    a first single crystal semiconductor substrate;
    a second single semiconductor substrate, such second substrate being a material different from the first substrate;
    a plurality of electrically interconnected active devices, one portion of the active devices being bipolar devices formed on the first substrate and another portion of the active devices comprising an insulated gate field effect transistor formed on the second substrate.

7. The current mirror recited in claim 6 wherein the first single crystal substrate is III-V material and the second single crystal substrate is silicon.

8. The current mirror recited in claim 7 wherein the first single crystal substrate is gallium arsenide.

9. The current mirror recited in claim 8 wherein the bipolar devices are HBTs.

10. The current mirror recited in claim 9 wherein the insulated gate field effect transistor is a MOS device.

* * * * *

UNITED STATES PATENT AND TRADEMARK OFFICE
CERTIFICATE OF CORRECTION

PATENT NO. : 6,424,224 B1  Page 1 of 1
DATED : July 23, 2002
INVENTOR(S) : McPartlin et al.

It is certified that error appears in the above-identified patent and that said Letters Patent is hereby corrected as shown below:

<u>Column 3,</u>
Line 34, delete "supply 44 is de" and replace with -- supply 44 is dc --.

Signed and Sealed this

Twenty-ninth Day of October, 2002

*Attest:*

*Attesting Officer*

JAMES E. ROGAN
*Director of the United States Patent and Trademark Office*